(12) United States Patent
Shiao et al.

(10) Patent No.: US 9,786,802 B2
(45) Date of Patent: Oct. 10, 2017

(54) PHOTOVOLTAIC ROOFING PANELS, PHOTOVOLTAIC ROOFING ASSEMBLIES, AND ROOFS USING THEM

(71) Applicant: CertainTeed Corporation, Valley Forge, PA (US)

(72) Inventors: Ming-Liang Shiao, Collegeville, PA (US); Husnu M. Kalkanoglu, Swarthmore, PA (US); Wayne E. Shaw, Glen Mills, PA (US); Gregory F. Jacobs, Oreland, PA (US)

(73) Assignee: CertainTeed Corporation, Malvern, PA (US)

( * ) Notice: Subject to any disclaimer, the term of this patent is extended or adjusted under 35 U.S.C. 154(b) by 606 days.

(21) Appl. No.: 13/835,454

(22) Filed: Mar. 15, 2013

(65) Prior Publication Data

US 2013/0199598 A1 Aug. 8, 2013

Related U.S. Application Data

(63) Continuation of application No. 12/268,313, filed on Nov. 10, 2008, now Pat. No. 8,418,415.

(Continued)

(51) Int. Cl.
*H01L 31/048* (2014.01)
*H02S 20/22* (2014.01)
(Continued)

(52) U.S. Cl.
CPC .......... *H01L 31/0483* (2013.01); *H02S 20/25* (2014.12); *Y02B 10/12* (2013.01)

(58) Field of Classification Search
None
See application file for complete search history.

(56) References Cited

U.S. PATENT DOCUMENTS

| 1,248,248 A | 11/1917 | Bishop |
| 3,579,940 A | 5/1971 | Greenleaf |

(Continued)

FOREIGN PATENT DOCUMENTS

| JP | 9-96055 | 4/1997 |
| WO | 90/10832 | 9/1990 |

(Continued)

OTHER PUBLICATIONS

The American Heritage Dictionary of the English Language ("Surface." The American Heritage Dictionary of the English Language. Eds. The Editors of the American Heritage Dictionaries and TheEditorsoftheAmericanHeritageDictionaries. Boston: Houghton Mifflin, 2011. Credo Reference. Web. Jul. 16, 2015).*

(Continued)

*Primary Examiner* — Magali P Slawski
(74) *Attorney, Agent, or Firm* — McDonnell Boehnen Hulbert & Berghoff LLP

(57) ABSTRACT

The present invention relates generally to photovoltaic devices, and more particularly to photovoltaic roofing products in which photovoltaic elements are affixed to roofing substrates. In one embodiment of the invention, a photovoltaic roofing panel comprising a roofing panel substrate having a top surface; and at least six discrete photovoltaic elements affixed to the roofing panel substrate with their photovoltaically-active areas exposed at the top surface of the roofing panel. Another embodiment of the invention is a photovoltaic roofing assembly comprising: a plurality of discrete photovoltaic roofing elements, each comprising one or more photovoltaic elements affixed to a roofing substrate; and a joining member, wherein the plurality of photovoltaic roofing elements are disposed on and affixed to the joining member and are electrically interconnected.

14 Claims, 6 Drawing Sheets

Related U.S. Application Data

(60) Provisional application No. 60/986,553, filed on Nov. 8, 2007.

(51) Int. Cl.
*H02S 20/23* (2014.01)
*H02S 20/25* (2014.01)

(56) References Cited

U.S. PATENT DOCUMENTS

| | | | |
|---|---|---|---|
| 3,833,425 | A | 9/1974 | Leinkram et al. |
| 4,321,416 | A | 3/1982 | Tennant |
| 4,366,197 | A | 12/1982 | Hanlon et al. |
| 5,092,939 | A | 3/1992 | Nath et al. |
| 5,232,518 | A | 8/1993 | Nath et al. |
| 5,273,608 | A * | 12/1993 | Nath .................. C09J 5/06 136/245 |
| 5,338,369 | A | 8/1994 | Rawlings |
| 5,437,735 | A * | 8/1995 | Younan .............. E04D 1/265 136/244 |
| 5,530,264 | A * | 6/1996 | Kataoka ............ H01L 31/048 136/259 |
| 5,575,861 | A | 11/1996 | Younan |
| 5,590,495 | A | 1/1997 | Bressler et al. |
| 5,837,363 | A * | 11/1998 | Colafati .................. B32B 5/18 428/218 |
| 5,968,287 | A | 10/1999 | Nath |
| 6,063,996 | A | 5/2000 | Takada et al. |
| 6,553,729 | B1 | 4/2003 | Nath et al. |
| 8,141,306 | B2 | 3/2012 | Masuda et al. |
| 8,418,415 | B2 | 4/2013 | Shiao |
| 2001/0054262 | A1 | 12/2001 | Nath et al. |
| 2002/0043031 | A1 | 4/2002 | Eguchi et al. |
| 2003/0121228 | A1 * | 7/2003 | Stoehr ................. H01L 31/0512 52/518 |
| 2004/0031518 | A1 * | 2/2004 | Plantfeber ............ H01L 31/048 136/251 |
| 2005/0012021 | A1 | 1/2005 | Middelman et al. |
| 2005/0178428 | A1 | 8/2005 | Laaly et al. |
| 2005/0178429 | A1 | 8/2005 | McCaskill et al. |
| 2005/0178430 | A1 | 8/2005 | McCaskill et al. |
| 2006/0042682 | A1 | 3/2006 | Wolfe et al. |
| 2008/0178928 | A1 * | 7/2008 | Warfield ............... H01L 31/048 136/251 |
| 2008/0236653 | A1 | 10/2008 | Kelly |
| 2008/0245405 | A1 | 10/2008 | Garvison et al. |

FOREIGN PATENT DOCUMENTS

| | | |
|---|---|---|
| WO | 93/14525 | 7/1993 |
| WO | 01/75377 | 10/2001 |
| WO | 01/94719 | 12/2001 |
| WO | 2004/066324 | 8/2004 |
| WO | 2006/043658 | 4/2006 |
| WO | 2007/064322 | 6/2007 |
| WO | 2008/137966 | 11/2008 |

OTHER PUBLICATIONS

PCT/US2008/083033 International Search Report and Written Opinion.
CertainTeed "Technical Data Shee" Published Oct. 2006.

* cited by examiner

PHOTOVOLTAIC ROOFING PANELS, PHOTOVOLTAIC ROOFING ASSEMBLIES, AND ROOFS USING THEM

CROSS-REFERENCE TO RELATED APPLICATIONS

This application is a continuation of U.S. patent application Ser. No. 12/268,313, filed Nov. 20, 2008, which claims priority under 35 U.S.C. §119(e) to U.S. Provisional Patent Application Ser. No. 60/986,553, filed Nov. 8, 2007, each of which is hereby incorporated herein by reference in its entirety.

BACKGROUND OF THE INVENTION

1. Field of the Invention

The present invention relates generally to photovoltaic devices. The present invention relates more particularly to photovoltaic roofing products in which photovoltaic elements are affixed to roofing substrates.

2. Summary of the Related Art

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Photovoltaic roofing elements can be used to provide weather protection, like standard roofing elements, as well as photovoltaic power generation. Many such photovoltaic roofing elements take the form of a standard roofing element, such as a shingle or a tile (e.g., having a surface area of a few square feet), with one or more photovoltaic cells disposed thereon or integrated therewith. Photovoltaic roofing elements are generally difficult to install, however, as they must not only be physically connected to the roof in a manner that provides weather protection but also be electrically interconnected into a wiring system to be connected to the elements of a larger photovoltaic generation system (e.g., inverters, batteries and meters). Such installation often requires an electrical specialist to perform the electrical interconnections, which can be difficult to time appropriately with the physical installation of the photovoltaic roofing elements. Moreover, installation of many such individual roofing elements can be time consuming, as it requires electrical interconnection of many, many individual photovoltaic roofing elements. Time consuming installation is especially inconvenient when a workperson must perform it while up on an often steep roof.

SUMMARY OF THE INVENTION

One aspect of the invention is a photovoltaic roofing panel comprising:
  a roofing panel substrate having a top surface; and
  at least six discrete photovoltaic elements affixed to the roofing panel substrate with their photovoltaically-active areas exposed at the top surface of the roofing panel.

Another aspect of the invention is a photovoltaic roofing assembly comprising:
  a plurality of discrete photovoltaic roofing elements, each comprising one or more photovoltaic elements affixed to a roofing substrate; and
  a joining member,
wherein the plurality of photovoltaic roofing elements are disposed on and affixed to the joining member and are electrically interconnected.

Another aspect of the invention is a photovoltaic roofing system disposed on a roof deck, the photovoltaic roofing system comprising a plurality of photovoltaic roofing panels or photovoltaic roofing assemblies as described above disposed on the roof deck.

Another aspect of the invention is a kit for the fabrication of a photovoltaic roofing assembly, the kit comprising:
  a plurality of discrete photovoltaic roofing elements, each comprising one or more photovoltaic elements affixed to a roofing substrate;
  at least one joining member; and
  wiring,
wherein the plurality of photovoltaic roofing elements are configured to be affixed to the at least one joining member, and the wiring is configured to interconnect the photovoltaic roofing elements to provide a photovoltaic roofing assembly.

The photovoltaic roofing panels, photovoltaic roofing assemblies and roofs of the present invention can result in a number of advantages over the prior art. For example, the photovoltaic roofing panels and photovoltaic roofing assemblies of the present invention can be installed on a roof in a reduced number to form a photovoltaic roofing system, thereby reducing the number of costly electrical connectors and on-panel electrical hardware needed. At a cost of $6-10 per connector, this can create a significant cost savings with respect to individual tile- or shingle-based systems. The use of the photovoltaic roofing panels and photovoltaic roofing assemblies can further reduce cost by reducing the time necessary for physical and electrical installation. Moreover, fewer electrical connectors can improve the reliability of the overall system by reducing the number of potential failure points.

The accompanying drawings are not necessarily to scale, and sizes of various elements can be distorted for clarity.

DETAILED DESCRIPTION OF THE INVENTION

Figure 1:
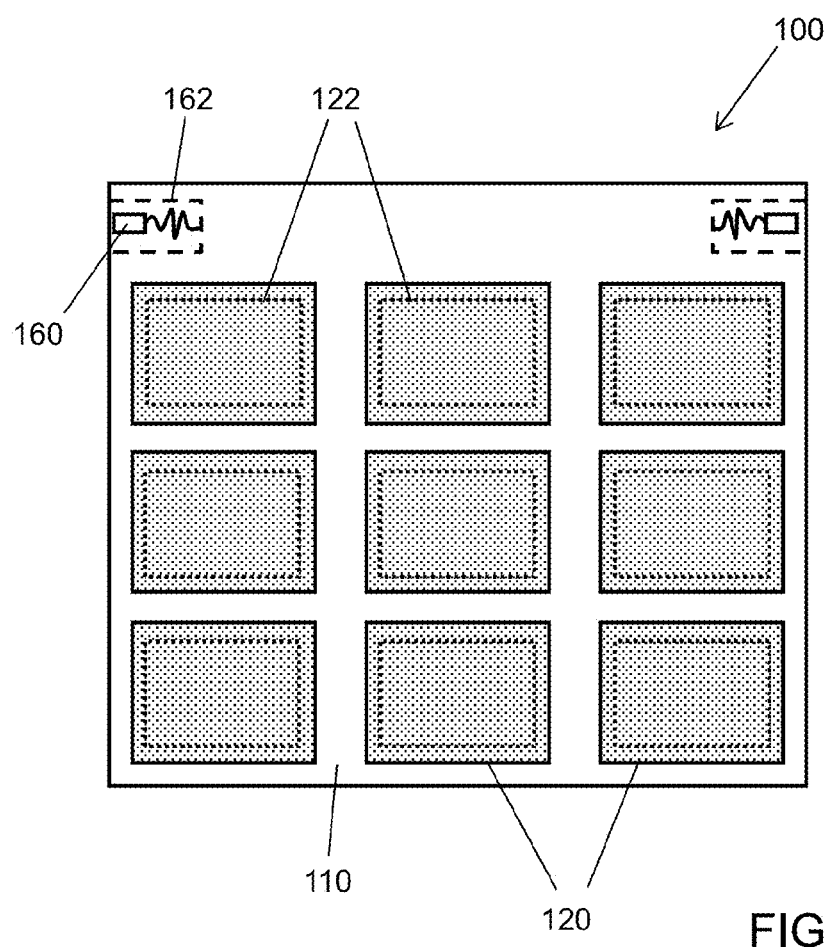
FIG. 1 is a top view of a photovoltaic roofing panel according to one embodiment of the invention.

One embodiment of a photovoltaic roofing panel according to the present invention is shown in top view in FIG. 1. Photovoltaic roofing panel 100 includes a roofing panel substrate 110 having a top surface. Photovoltaic roofing panel 100 also includes at least six (nine in this example) photovoltaic elements 120 affixed to the roofing panel substrate 110, with their photovoltaically-active areas 122 exposed at the top surface of the roofing panel substrate 110. The photovoltaic roofing panel can include, for example, at least six, at least ten, or even at least twenty discrete photovoltaic elements. Accordingly, the dimensional size/footprint of the photovoltaic roofing panel can be increased, reducing the time required for physical installation of a photovoltaic roofing system using such photovoltaic roofing panels. For example, in certain embodiments of the invention, the roofing panel substrate is at least 0.7 m² in area, or even at least 1.0 m² in area.

The photovoltaic element comprises one or more interconnected photovoltaic cells. The photovoltaic cells of the photovoltaic element can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide or CIGS. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of encapsulated photovoltaic elements for use in the present invention. In one embodiment of the invention, the photovoltaic element includes a monocrystalline silicon photovoltaic cell or a polycrystalline silicon photovoltaic cell.

The photovoltaic element can be an encapsulated photovoltaic element, in which photovoltaic cells are encapsulated between various layers of material. For example, encapsulated photovoltaic element can include a top layer material at its top surface, and a bottom layer material at its bottom surface. The top layer material can, for example, provide environmental protection and/or electrical insulation to the underlying photovoltaic cells, and any other underlying layers. Examples of suitable materials for the top layer material include fluoropolymers, for example ETFE (e.g., NORTON® ETFE film, available from Saint Gobain), PFE, FEP (e.g., NORTON® FEP film, available from Saint Gobain), PCTFE or PVDF. The top layer material can alternatively be, for example, a glass sheet, or a non-fluorinated polymeric material. The bottom layer material can be, for example, a fluoropolymer, for example ETFE, PFE, FEP, PVDF or PVF ("TEDLAR"). The bottom layer material can alternatively be, for example, a polymeric material (e.g., polyester such as PET); or a metallic material (e.g., stainless steel or aluminum sheet).

Figure 2:
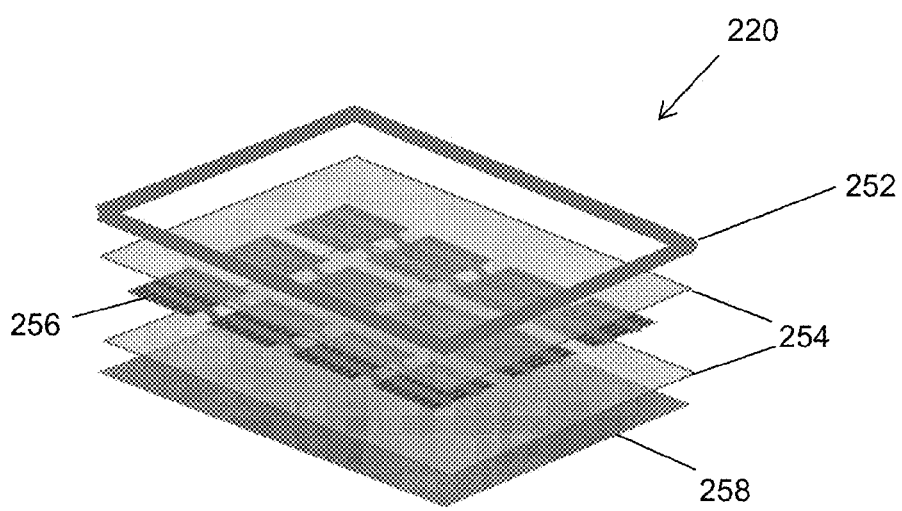
FIG. 2 is a schematic exploded view of an encapsulated photovoltaic element suitable for use in the present invention.

As the person of skill in the art will appreciate, an encapsulated photovoltaic element can include other layers interspersed between the top layer material and the bottom layer material. For example, an encapsulated photovoltaic element can include structural elements (e.g., a reinforcing layer of glass, metal or polymer fibers or hollow spheres, or a rigid film); adhesive layers (e.g., EVA to adhere other layers together); mounting structures (e.g., clips, holes, or tabs); and one or more optionally connectorized electrical cables for electrically interconnecting the photovoltaic cell (s) of the encapsulated photovoltaic element with an electrical system. An example of an encapsulated photovoltaic element suitable for use in the present invention is shown in schematic exploded view in FIG. 2. Encapsulated photovoltaic element 220 includes a top protective layer 252 (e.g., glass or a fluoropolymer film such as ETFE, FEP, PFA or PCTFE); encapsulant layers 254 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 256; and a backing layer 258 (e.g., PVDF, PVF, PET).

The photovoltaic element can include at least one antireflection coating, for example as the top layer material in an encapsulated photovoltaic element, or disposed between the top layer material and the photovoltaic cells.

Suitable photovoltaic cells and/or elements can be obtained, for example, from China Electric Equipment Group of Nanjing, China, as well as from several domestic suppliers such as Uni-Solar, Sharp, Shell Solar, BP Solar, USFC, FirstSolar, General Electric, Schott Solar, Evergreen Solar and Global Solar. Moreover, the person of skill in the art can fabricate encapsulated photovoltaic elements using techniques such as lamination or autoclave processes. Encapsulated photovoltaic elements can be made, for example, using methods disclosed in U.S. Pat. No. 5,273,608, which is hereby incorporated herein by reference.

The top surface of photovoltaic element is the surface presenting its photovoltaically-active area (i.e., the photo-electrically-active areas of its one or more photoelectric cells). When installed, the photovoltaic roofing elements of the present invention should be oriented so that the top surface of the photovoltaic element is able to be illuminated by solar radiation.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The invention can be practiced with a variety of roofing panel substrates. The roofing panel substrate can be, for example, a polymeric panel substrate (e.g., formed from polyethylene, polypropylene or PVC). Other suitable polymers include polyolefin, ABS, ASA, AES, polycarbonates, nylons, EPDM, fluoropolymers, silicone, rubbers, thermoplastic elastomers, polyesters, PBT, poly(meth)acrylates and epoxies, each of which can be filled or unfilled. In other embodiments of the invention, the roofing panel substrate is a metallic panel substrate (e.g., formed from aluminum or stainless steel, optionally coated with a polymer film), or a bituminous panel substrate (e.g., formed from a fiber-reinforced asphalt material), or is made from cementitious, membrane, or composite material. The roofing panel substrate can be rigid, or can be semi-rigid or flexible.

The photovoltaic elements can be affixed to the roofing panel substrate using any convenient method. For example, in certain embodiments of the invention, the photovoltaic element can be joined to the roofing substrate through a tie layer system, as described in the U.S. patent application Ser. No. 11/266,409, as well as U.S. Provisional Patent Application Ser. No. 60/985,932, filed Nov. 6, 2007; Ser. No. 60/985,935, filed Nov. 6, 2007; and Ser. No. 60/986,556, filed Nov. 8, 2007, each of which is hereby incorporated herein by reference in its entirety. Examples of suitable tie layers, depending on the application, include oxidized asphalt, SBS-modified asphalt, APP-modified asphalt, silicones, adhesives, polypropylene/EVA blends, pressure-sensitive adhesives, and maleic anhydride-grafted EVA, polypropylene/polyethylene copolymers, butyl adhesives, pressure sensitive adhesives, or functionalized EVA. The tie layer systems can also include a layer of fibrous material, mineral particles, roofing granules, felt, or porous web partially embedded in the material of the roofing panel substrate. In other embodiments of the invention, the photovoltaic elements are affixed to the roofing panel substrate when it is in a molten form, for example in a compression molding process (e.g., as described in U.S. patent application Ser. No. 12/146,986, which is hereby incorporated herein by reference in its entirety), or by heating the material of the roofing panel substrate then pressing in the photovoltaic element.

The photovoltaic elements can be affixed to the roofing panel substrate in a number of ways. The photovoltaic elements can be, for example, disposed on the top surface of the roofing panel substrate. In other embodiments, the photovoltaic elements are affixed to the underside of the roofing panel substrate with their photovoltaically-active areas visible at the top surface of the roofing panel substrate through holes formed therein; a potting agent, sealant or adhesive can be used to provide a water-tight seal.

In one embodiment of the invention, the top surface of the exposed area of the roofing panel substrate has a three-dimensional surface relief. For example, in certain embodiments of the invention, the top surface of the roofing panel substrate can be formed to have a surface profile that provides the visual impression of a plurality individual and unique pieces (e.g., as a plurality of shingles, shakes, slates or tiles). For example, in one embodiment of the invention, the top surface of the roofing panel substrate is formed to have the configuration of a horizontally-extending row of roofing shingles, tiles, slates, or shakes, as shown in top view in FIG. 3, in which photovoltaic roofing panel 300 comprises a roofing panel substrate 310 molded with six individual roofing tile profiles 316 in its top surface. In this embodiment of the invention, the photovoltaic elements 320 can be, for example, arranged horizontally (e.g., one on each roofing tile profile). In certain embodiments of the invention, the roofing panel substrate is at least 1.5 m in horizontal length. The panel can be formed with a top surface that approximates a row of shakes, for example, similar to that of the siding product available from CertainTeed Corporation under the trade name NORTHWOODS, or a row of slates, tiles or shingles. In other embodiments, a smaller headlap portion is employed with an interlock system to close the joints between adjacent roofing panels, analogous to that used in the siding product available from CertainTeed Corporation under the trade name NORTHWOODS.

Figure 3:
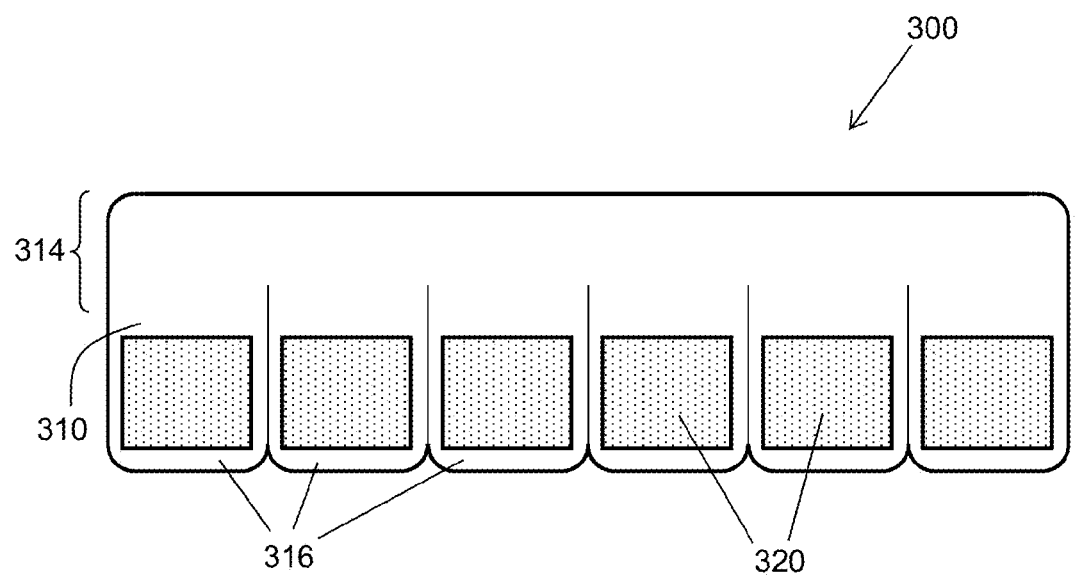
FIG. 3 is a schematic top view of a photovoltaic roofing panel according to another embodiment of the invention.

In certain embodiments of the invention, the profiled shapes are provided in the portions of the roofing panel substrate that are visible when installed, but do not extend throughout the portions of the roofing panel that are not visible when installed. For example, as shown in FIG. 3, the profile shapes do not extend into the headlap portion 314 of roofing panel substrate 310.

Figure 4:
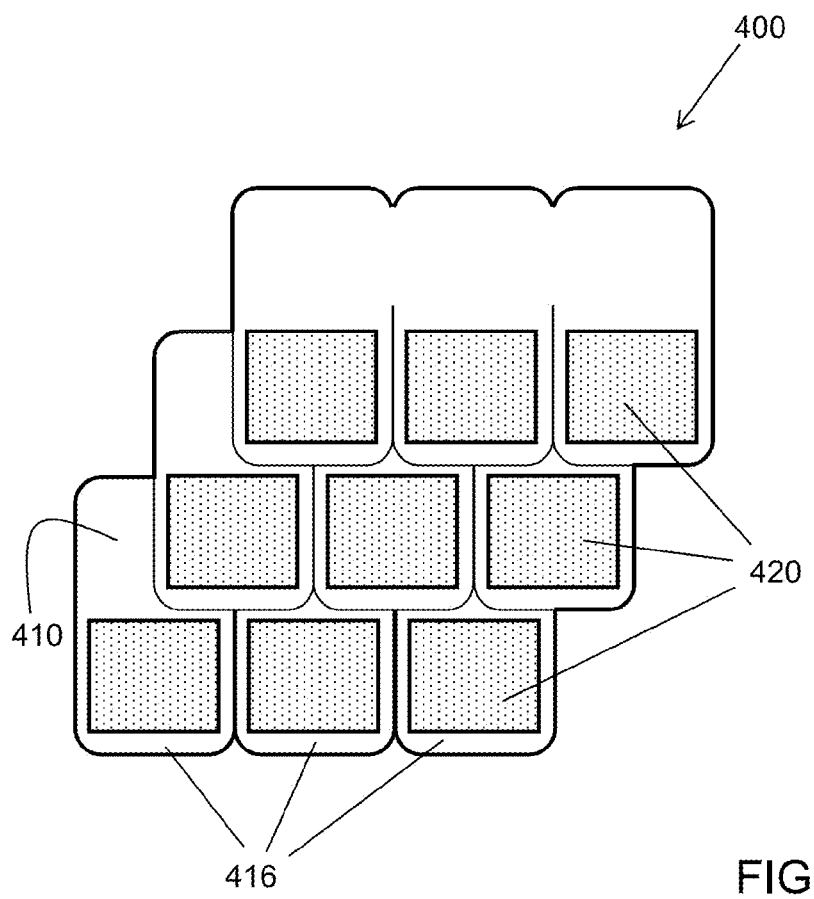
FIG. 4 is a schematic top view of a photovoltaic roofing panel according to another embodiment of the invention.

In other embodiments of the invention, the roofing panel substrate has a top surface formed to provide the appearance of a two-dimensional array of shingles, shakes, slates or tiles, overlapping as they would be when installed on a roof; in such embodiments, the photovoltaic elements can be arranged in a two-dimensional array. For example, as shown in top view in FIG. 4, photovoltaic roofing panel 400 is made using a roofing panel substrate 410 formed with a two-dimensional array of roofing tile elements 416 in its top surface. Photovoltaic elements 420 are arranged in a two-dimensional array. Of course, the three dimensional surface relief can in other embodiments of the invention provide any other desired appearance.

A variety of manufacturing processes can be used to make the photovoltaic roofing panels of the present invention. For example, roofing panel substrates can be produced by extrusion of a thermoplastic polymer followed by continuous vacuum forming to form a three-dimensional surface relief as described above and/or depressions in which photovoltaic elements can be disposed. In other embodiments, sheet can be extruded and polymeric roofing panel substrates shaped serially by vacuum forming or compression molding (e.g., as described in U.S. patent application Ser. No. 12/146,986). In other embodiments, the roofing panel substrate can be injection molded to form a plurality of shake-, slate- or tile-like shapes in a single roofing panel substrate. In some forming processes, the photovoltaic elements can be affixed to the roofing panel substrate at the same time as it is molded (e.g., through compression molding). In certain embodiments of the invention, the roofing panel substrate is formed from a unitary sheet of material.

In one embodiment of the invention, the discrete photovoltaic elements are electrically interconnected. These electrical interconnections can be hard-wired, and therefore require no expensive connectors therebetween. Moreover, these electrical interconnections can be performed in a factory setting by skilled electrical workers or by automated processes, instead of at the site of the installation of the photovoltaic roofing system. Interconnections can be made with, for example, using wiring such as wire or wire ribbon, which can have relatively low cost. Connections can be made using methods and configurations analogous to those used in interconnecting individual elements within conventional photovoltaic modules or photovoltaic roofing elements. The photovoltaic elements can be connected, for example, in series, in parallel, or in series-parallel. Moreover, the wiring can include bypass diodes configured to take individual photovoltaic elements or groups thereof out of the circuit in case of high resistance due to shading or failure. In this embodiment of the invention, the photovoltaic roofing panel can present a sufficiently large photovoltaically-active area, and can be installed cost-effectively with a reduced number of connection points and associated connectors and/or junction boxes.

In certain embodiments of the invention, the photovoltaic roofing panel has no more than three electrical connectors operatively connected to the interconnected photovoltaic elements, for interconnection of the photovoltaic roofing panel to a larger circuit for the transport of photovoltaically-generated energy for use or sale. In the embodiment of the invention shown in FIG. 1, the photovoltaic roofing panel 100 includes connectors 160, operatively connected to photovoltaic elements 110. In the embodiment in FIG. 1, space for the connectors and their associated wiring is provided in a recess 162 on the bottom surface of the roofing panel substrate. In other embodiments of the invention, the connector and its associated wiring can be provided in a recess formed in the top surface of the roofing panel substrate; the connection can be protected by an overlapping roofing panel or a watertight covering, or through the use of waterproof connectors. Suitable connectors are available, for example, from Tyco under the tradename Solarlok®, or from Multi-Connector under the tradename Solar Line®. In these embodiments of the invention, photovoltaic roofing panels can be conveniently electrically interconnected with a minimum of connection operations.

In certain embodiments of the invention, wiring is disposed on the top surface of the roofing panel substrate, for example at a level lower than the top level of the roofing substrate. For example, in one embodiment of the invention, the wiring is disposed within a channel in the top surface of the roofing panel substrate. The wiring can be sealed into the channel, for example, by a sealant such as caulk or a polymeric material. The sealant can be colored to match the color of the roofing panel substrate, so as to maintain a desirable aesthetic appearance.

In another embodiment of the invention, the wiring can be disposed along the bottom surface of the roofing panel substrate. For example, in one embodiment of the invention, the roofing panel substrate has a void space (e.g., a channel, or a larger recess) formed in its bottom surface, in which the wiring is disposed. When the photovoltaic roofing elements are disposed on the top surface of the roofing panel substrate, the wiring can be fed through small holes to the bottom surface of the roofing panel for interconnection.

Figure 5:
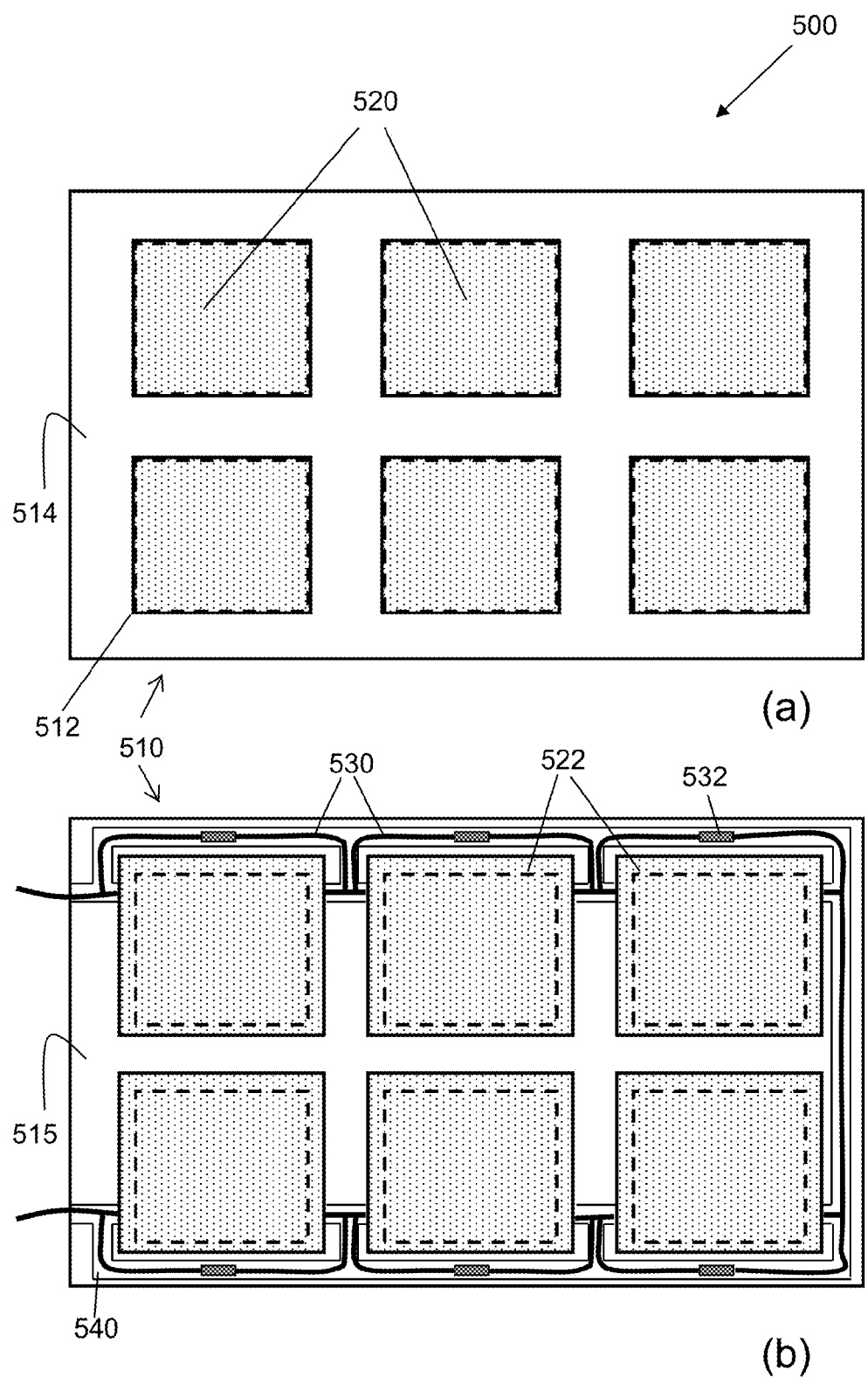
FIG. 5 is a schematic top view of a photovoltaic roofing panel according to another embodiment of the invention.

One embodiment of the invention is shown in top view (part (a)) and bottom view (part(b)) in FIG. 5. In this embodiment of the invention, the roofing panel substrate has a plurality of openings formed therein, and the photovoltaic elements are disposed on the bottom surface of the roofing panel with their photovoltaically-active areas disposed in the openings of the roofing panel. Photovoltaic roofing panel 500 includes six photovoltaic elements 520 affixed to the bottom surface 515 of roofing panel substrate 510, in registration with openings 512 formed therein, so that their photovoltaically-active areas 522 are visible at the top surface 514 of roofing panel substrate 510. Wiring (including wires 530 and bypass diodes 532) is disposed in recesses 540 formed in the bottom surface 515 of the roofing panel substrate 510. In this embodiment of the invention, the void space in the bottom surface of the substrate is shown as channels. In other embodiments, the void space can be created in the molding process that forms a three-dimensional surface relief, with the void space in the bottom substantially following the contour of the three-dimensional surface relief.

In certain embodiments of the invention, a substantially transparent layer is disposed over the plurality of the photovoltaic elements. The substantially transparent layer can be, for example, a polymeric layer that provides environmental protection and electrical insulation to the photovoltaic elements. In embodiments of the invention in which holes are formed in the roofing substrate (e.g., for feedthrough of wiring or to create windows for photovoltaic elements), the polymeric layer can help to seal the holes from moisture. Such a polymeric layer can be, for example a fluoropolymer film such as ETFE, FEP, PFA or PCTFE, or a non-fluorinated polymer, and can be affixed to the photovoltaic elements and the roofing panel substrate through an adhesive layer such as an EVA-based material.

Figure 6:
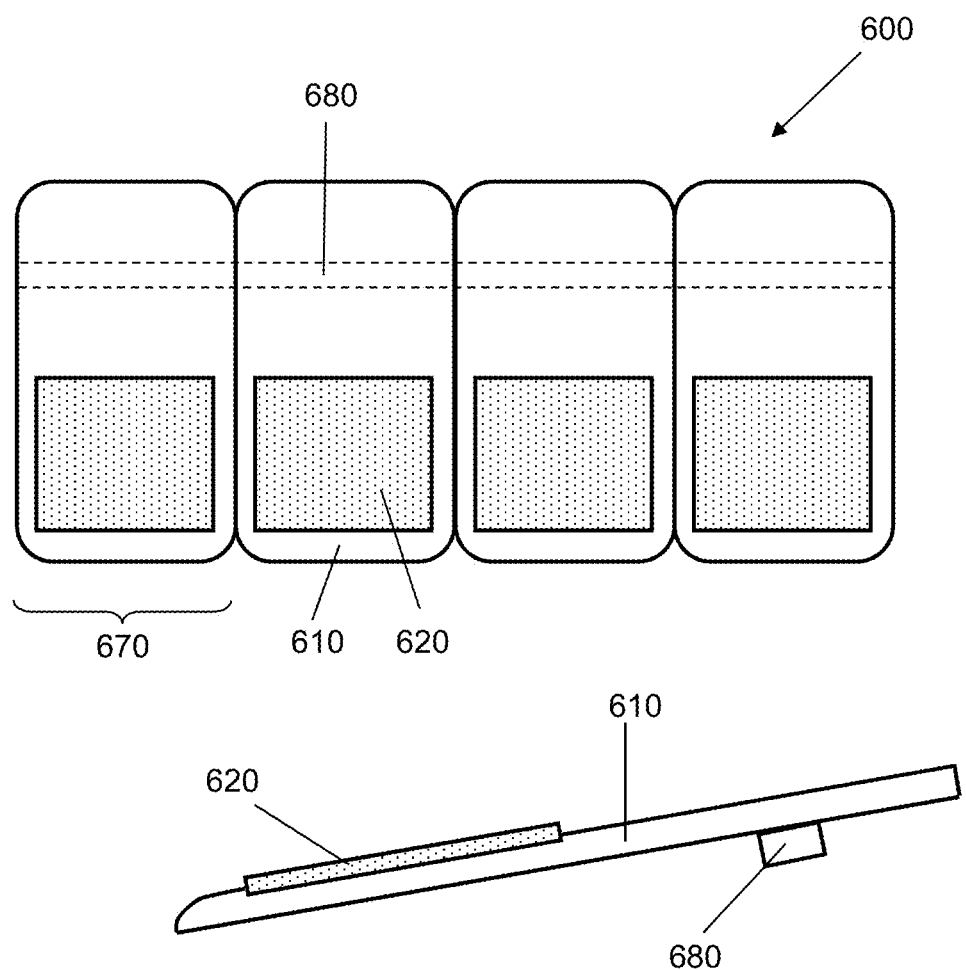
FIG. 6 is a schematic top view and a schematic side view of a photovoltaic roofing assembly according to one embodiment of the invention.

Another aspect of the invention is a photovoltaic roofing assembly, an example of which is shown in schematic top view and in schematic side view in FIG. 6. Photovoltaic roofing assembly 600 comprises one or more (four, in this example) discrete photovoltaic roofing elements 670, each comprising a roofing substrate 610 with a photovoltaic element 620 affixed thereto (e.g., as described above with respect to the photovoltaic roofing panels). The photovoltaic roofing elements 670 are affixed to joining member 680, which holds the collection of photovoltaic roofing elements together into a single panel-like structure. The discrete photovoltaic roofing elements can be physically and electrically interconnected before they are installed on a roof, making on-roof installation far simpler, as described above. Moreover, hard wiring can be used to electrically interconnect the photovoltaic roofing elements, reducing the number of costly connectors necessary as described above. The individual roofing elements can be provided with differing color, composition, or shape characteristics in order to provide a desired aesthetic effect. In certain embodiments of the invention, the photovoltaic roofing assembly includes at least four, at least six, at least ten, or even at least twenty photovoltaic roofing elements.

This aspect of the invention can be practiced using any of a number of types of roofing substrates. For example, in certain embodiments of the invention, the top surface of the roofing substrate is polymeric (e.g., a polymeric material, or a polymeric coating on a metallic material). In other embodiments of the invention, the top surface of the roofing substrate is metallic. In other embodiments of the invention, the top surface of the roofing substrate is coated with roofing granules (e.g., a bituminous material coated with roofing granules). In other embodiments of the invention, the top surface of the roofing substrate is bituminous (e.g., an uncoated bituminous roofing substrate). For example, the roofing substrate can be an asphalt roofing shingle (e.g., coated with roofing granules, or uncoated by roofing granules in the area upon which the encapsulated photovoltaic element and tie layer system are disposed). In other embodiments of the invention, the roofing substrate is polymeric. For example, the roofing substrate can be a polymeric roofing tile, slate or shake. Individual tile, slate or shake elements can be formed, for example, using the processes described in U.S. patent application Ser. No. 12/146,986, and U.S. Patent Application Publications nos. 2006/0029775, 2007/0114698, 2007/0114697, 2005/0217199, 2004/0117,596, and 2004/0178532, each of which is hereby incorporated herein by reference in its entirety. Suitable polymers include, for example, polyolefin, polyethylene, polypropylene, ABS, PVC, polycarbonates, nylons, EPDM, fluoropolymers, silicone, rubbers, thermoplastic elastomers, polyesters, PBT, poly(meth)acrylates, epoxies, and can be filled or unfilled or formed. For example, in one embodiment of the invention the roofing substrate has polypropylene at its top surface. In certain embodiments of the invention, the roofing substrate does not have a fluoropolymer at its top surface. In other embodiments of the invention, the roofing substrate is a metal panel. The roofing substrate can be made of other materials, such as composite, ceramic, or cementitious materials. As described above with respect to the photovoltaic roofing panel, a tie layer system can be used in affixing the photovoltaic element to the roofing substrate.

The one or more joining members can take a number of forms. For example, they can take the form of one or more battens to which horizontal rows of photovoltaic roofing elements are affixed. In other embodiments of the invention, the joining member is a sheet, or a lattice-type structure. In certain embodiments, the joining member is foldable, and the photovoltaic roofing assembly can is unfolded when it is installed on a roof. The photovoltaic roofing elements can be affixed to the joining member(s) in any convenient manner. For example, they can be affixed by mechanical fastening (e.g., nailing, screwing, clipping), or through an adhesive material. In certain embodiments of the invention, when the roofing substrates have polymeric bottom surfaces, the joining member is a thermoplastic polymer compatible with the roofing substrates; heat and pressure (e.g., techniques such as ultrasonic welding or vibratory welding) can be used to affix the roofing substrates to the joining members. The photovoltaic elements can be affixed to the roofing substrates either before, after, or at the same time as the roofing substrates are affixed to the joining member. In certain embodiments of the invention, the joining member can have wiring disposed therein, in order to provide electrical connection between the photovoltaic roofing elements, as described in U.S. patent application Ser. No. 12/266,498, which is hereby incorporated herein by reference in its entirety.

Figure 7:
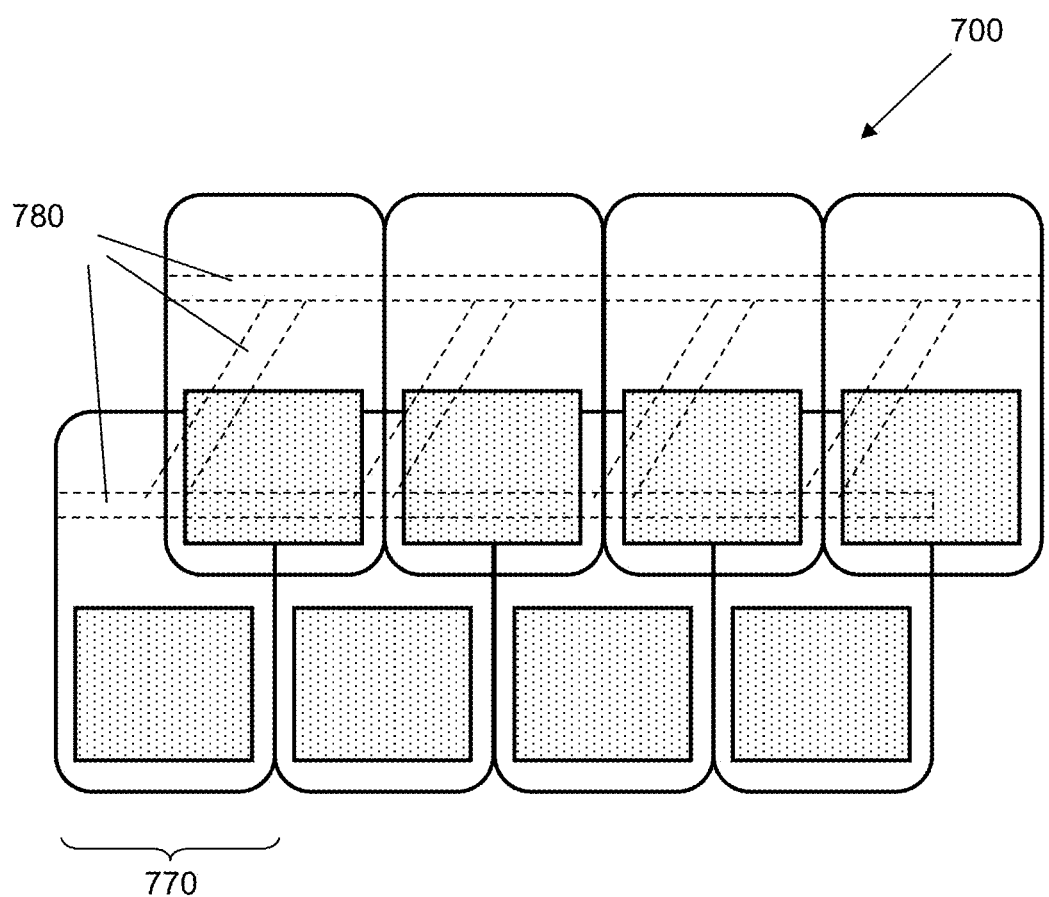
FIG. 7 is a schematic top view of a photovoltaic roofing assembly according to one embodiment of the invention.

The discrete photovoltaic roofing elements can be arranged in any desirable fashion according to this aspect of the invention. For example, in one embodiment of the invention, the discrete photovoltaic roofing elements are arranged horizontally, as shown in FIG. 6. In other embodiments of the invention, the discrete photovoltaic elements are arranged in a two-dimensional array. For example, in the photovoltaic roofing assembly 700 shown in schematic top and side views in FIG. 7, photovoltaic roofing elements 770 are disposed in a two-dimensional array, held together by joining members 780, in this example a lattice-like structure.

Figure 8:
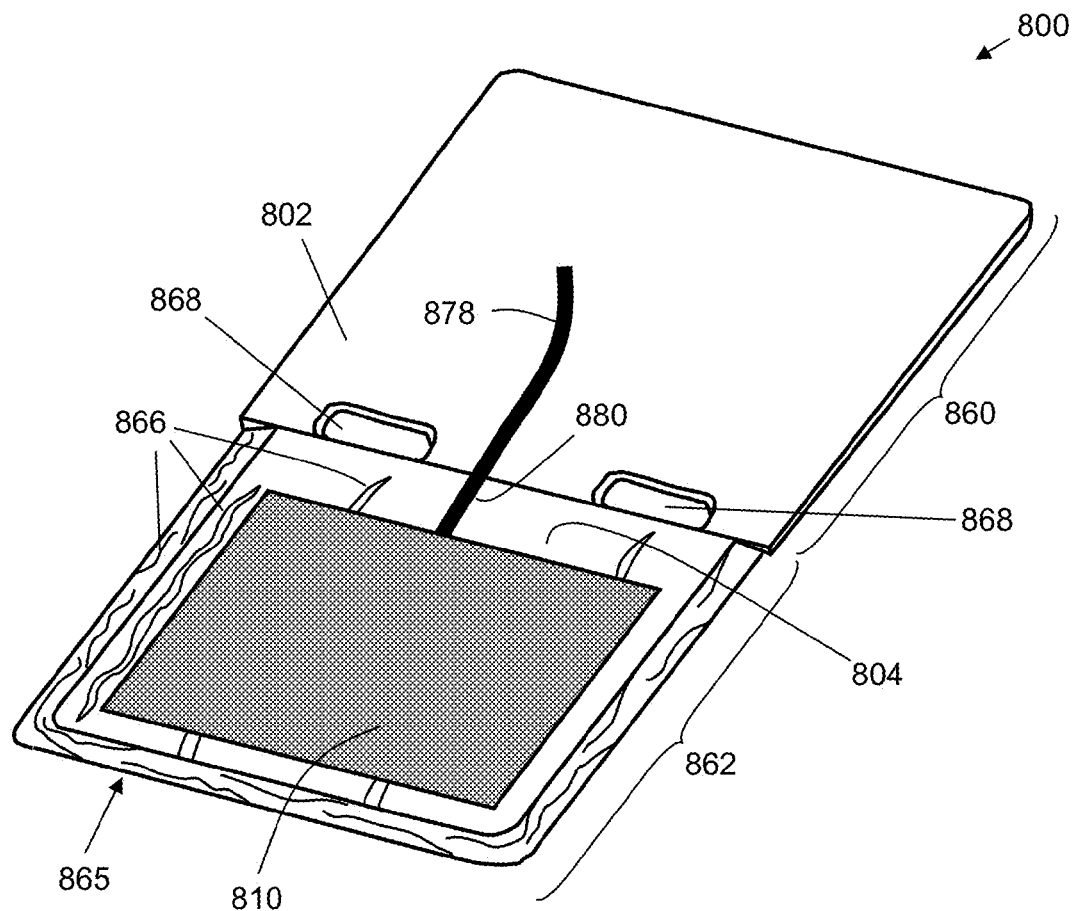
FIG. 8 is a schematic top perspective view of a photovoltaic roofing element suitable for use in the present invention.

One suitable photovoltaic roofing element for use according to this aspect of the invention is shown in top perspective view in FIG. 8. FIG. 8 shows a particular photovoltaic roofing element according to this aspect of the invention. Photovoltaic roofing element 800 includes a polymeric carrier tile 802 having a headlap portion 860 and a butt portion 862. The photovoltaic element 810 is affixed to polymeric carrier tile 802 in its butt portion 862. In certain embodiments of the invention, and as shown in FIG. 8, the butt portion 862 of the polymeric carrier tile 802 has features 866 molded into its surface, in order to provide a desired appearance to the polymeric carrier tile. In the embodiment shown in FIG. 8, the polymeric carrier tile 802 has a pair of recessed nailing areas 868 formed in its headlap portion 860, for example as described in International Patent Application Publication no. WO 08/052029, which is hereby incorporated herein by reference in its entirety. In certain embodiments of the invention, and as shown in FIG. 8, the photovoltaic element 810 has coupled to it at least one electrical lead 878. The electrical lead can be disposed in a channel 880 formed in the top surface 804 of the polymeric carrier tile 802. The U-shaped periphery along the right and left sides and lower edge of the butt portion 862 slopes downwardly from its top surface to its bottom surface, as shown at 865. Examples of these photovoltaic roofing elements are described in more detail in U.S. patent application Ser. No. 12/146,986, which is hereby incorporated herein by reference in its entirety.

The photovoltaic roofing assemblies according to this aspect of the invention can have many of the features described above with respect to photovoltaic roofing panels. For example, the photovoltaic roofing assembly can be least 0.7 $m^2$ in area, or even at least 1.0 $m^2$ in area. Similarly, the photovoltaic roofing assembly can be at least 1.5 m in horizontal length. The photovoltaic roofing assemblies can, in some embodiments, have no more than three electrical connectors for interconnection with other photovoltaic roofing panels and/or into an electrical system.

As described above, the photovoltaic roofing assemblies can be assembled and interconnected before they are installed on a roof. Accordingly, in one embodiment of the invention, the photovoltaic roofing assembly is not disposed on a roof. Similarly, another aspect of the invention is a method of installing a photovoltaic roofing system on a roof deck, the method comprising: providing a plurality of photovoltaic roofing assemblies as described above, then disposing them on the roof deck and electrically interconnecting them. As the photovoltaic roofing assemblies can have relatively large area and relatively few connectors, this method can involve a reduced amount of time and effort when compared to the installation of individual photovoltaic roofing elements.

The photovoltaic roofing panels and photovoltaic roofing assemblies can be constructed with venting structures, for example as described in U.S. Provisional Patent Application No. 60/986,425 and in U.S. Pat. Nos. 6,061,978; 6,883,290; and 7,187,295, each of which is incorporated herein by reference in its entirety. Likewise, the photovoltaic roofing panels and photovoltaic roofing assemblies can be constructed with roofing substrates having zoned functional composition, for example as described in U.S. Provisional Patent Application Ser. No. 61/089,594, which is incorporated herein by reference in its entirety.

The photovoltaic roofing panels and photovoltaic roofing elements used in the present invention can have other features. For example, additional surfacing media such as silica granules or polymer granules with high transmittance to solar radiation can be disposed on the top surface of the photovoltaic element to provide a textured surface or added aesthetic value, such as described in U.S. patent application Ser. No. 11/742,909, which is hereby incorporated herein by reference in its entirety. The photovoltaic roofing panels and photovoltaic roofing elements can also include a colored and/or patterned layer, for example to tune the appearance and/or to provide a masking effect to the photovoltaic cells themselves. The colors and/or patterns can be created using, for example, optical interference, stacks of dielectric layers, special bandwidth-transmissive pigments, nanometallic particles (e.g., Cermet Film available from Saint-Gobain Corp.), or quantum dot technology. Colored or patterned layers disposed over the photovoltaic cells are described, for example, in U.S. patent application Ser. No. 12/145,166, which is hereby incorporated herein by reference in its entirety. Reflective, colored or patterned layers can also be provided on the roofing panel substrates and roofing substrates, for example as described in U.S. patent application Ser. Nos. 12/266,481 and 12/267,458, each of which is hereby incorporated herein by reference in its entirety.

One or more of the photovoltaic roofing panels or photovoltaic roofing assemblies described above can be installed on a roof as part of a photovoltaic system for the generation of electric power. Accordingly, one embodiment of the invention is a photovoltaic roofing system disposed on a roof deck, the photovoltaic roofing system comprising one or more photovoltaic roofing panels or photovoltaic roofing assemblies as described above disposed on a roof deck. The photovoltaic elements of the photovoltaic roofing panels or photovoltaic roofing assemblies are desirably connected to an electrical system, either in series, in parallel, or in series-parallel, as would be recognized by the skilled artisan. There can be one or more layers of material, such as underlayment, between the roof deck and the photovoltaic roofing system of the present invention. Electrical connections are desirably made using cables, connectors and methods that meet UNDERWRITERS LABORATORIES and NATIONAL ELECTRICAL CODE standards. Even when the photovoltaic roofing panels or photovoltaic roofing assemblies of the present invention are not installed on top of preexisting roofing materials, the roof can also include one or more standard roofing elements, for example to provide weather protection at the edges of the roof, or in any hips, valleys, and ridges of the roof.

Another aspect of the invention is a kit for the fabrication of the photovoltaic roofing assembly. The kit comprises a plurality of discrete photovoltaic roofing elements, each comprising one or more photovoltaic elements affixed to a roofing substrate; at least one joining member; and wiring, all as described above. The plurality of photovoltaic roofing elements are configured to be affixed to the at least one joining member, and the wiring is configured to interconnect the photovoltaic roofing elements to provide a photovoltaic roofing assembly, as described above. The kit can also include instructions for the assembly of the photovoltaic roofing assembly, e.g., by affixing the photovoltaic roofing elements to the at least one joining member, and electrically interconnecting them with the wiring. The kit can be provided in a single package, or sold together in multiple packages.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing panel having a top surface and a bottom surface, the roofing panel comprising:
    a roofing panel substrate consisting of a unitary sheet of rigid material, the roofing panel substrate having a top surface and a bottom surface; and
    at least six discrete photovoltaic elements affixed to the roofing panel substrate with their photovoltaically-active areas exposed at the top surface of the roofing panel, the photovoltaic elements being electrically interconnected with one another by wiring disposed beneath the roofing panel substrate,
    wherein the top surface of the roofing panel substrate is formed with a three-dimensional surface relief to appear as a two dimensional array of roofing shingles, tiles, slates or shakes,
    wherein the number of photovoltaic elements is the same as the number of array elements of the three-dimensional surface relief,
    wherein each photovoltaic element is disposed in registration with a different one of the array elements of the three-dimensional surface relief, and
    wherein the bottom surface of the roofing panel substrate substantially follows the contour of the three-dimensional surface relief of the top surface of the roofing panel substrate thereby forming a void space, and wherein the wiring is disposed in the void space along the bottom surface of the roofing panel substrate.

2. The photovoltaic roofing panel of claim 1, wherein the photovoltaic elements are hard-wired to one another.

3. The photovoltaic roofing panel of claim 2, further comprising no more than three electrical connectors operatively connected to the interconnected photovoltaic elements.

4. The photovoltaic roofing panel of claim 1, wherein the roofing panel at least 1.5 m in horizontal length.

5. The photovoltaic roofing panel of claim 1, comprising at least ten discrete photovoltaic elements affixed to the roofing panel substrate with their photovoltaically-active areas exposed at the top surface of the roofing panel.

6. The photovoltaic roofing panel of claim 1, comprising at least twenty discrete photovoltaic elements affixed to the roofing panel substrate with their photovoltaically-active areas exposed at the top surface of the roofing panel.

7. The photovoltaic roofing panel of claim 1, wherein the three-dimensional surface relief is provided in the portions of the roofing panel substrate that are visible when installed, but does not extend throughout the portions of the roofing panel that are not visible when installed.

8. The photovoltaic roofing panel of claim 1, wherein the roofing panel substrate is a polymeric roofing panel substrate.

9. The photovoltaic roofing panel of claim 1, further comprising an encapsulant layer disposed over the plurality of photovoltaic elements.

10. The photovoltaic roofing panel of claim 1, having an area of at least 0.7 m$^2$.

11. The photovoltaic roofing panel of claim 1, having an area of at least 1.0 m$^2$.

12. A photovoltaic roofing system disposed on a roof deck, the photovoltaic roofing system comprising a plurality of photovoltaic roofing panels of claim 1 disposed on a roof deck.

13. The photovoltaic roofing panel of claim 1, wherein the discrete photovoltaic elements are spaced apart from each other and encapsulated.

14. The photovoltaic roofing panel of claim 1, wherein the photovoltaic elements are disposed on the top surface of the roofing panel.

* * * * *